(12) United States Patent
Kirkpatrick et al.

(10) Patent No.: US 7,785,957 B2
(45) Date of Patent: Aug. 31, 2010

(54) POST METAL GATE VT ADJUST ETCH CLEAN

(75) Inventors: Brian K. Kirkpatrick, Allen, TX (US); Jinhan Choi, Frisco, TX (US); Randall W. Pak, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 61 days.

(21) Appl. No.: 12/344,422

(22) Filed: Dec. 26, 2008

(65) Prior Publication Data
US 2010/0167514 A1  Jul. 1, 2010

(51) Int. Cl.
H01L 21/00  (2006.01)
(52) U.S. Cl. .................. 438/229; 438/592; 438/906
(58) Field of Classification Search ......... 438/228–231, 438/592, 906
See application file for complete search history.

(56) References Cited

U.S. PATENT DOCUMENTS

2005/0176604 A1  8/2005  Lee et al.
2007/0197037 A1*  8/2007  Yeh et al. ................. 438/704
2008/0050879 A1*  2/2008  Hung et al. .............. 438/287

* cited by examiner

Primary Examiner—Richard A. Booth
(74) Attorney, Agent, or Firm—Warren L. Franz; Wade J. Brady, III; Frederick J. Telecky, Jr.

(57) ABSTRACT

A method for fabricating a CMOS integrated circuit (IC) includes providing a substrate having a semiconductor surface, wherein the semiconductor surface has PMOS regions for PMOS devices and NMOS regions for NMOS devices. A gate dielectric layer is formed on the semiconductor surface followed by forming at least a first metal including layer on the gate dielectric layer. A polysilicon or amorphous silicon layer is formed on the first metal including layer to form an intermediate gate electrode stack. A masking pattern is formed on the intermediate gate electrode stack. The polysilicon or amorphous silicon layer is dry etched using the masking pattern to define a patterned intermediate gate electrode stack over the NMOS or PMOS regions, wherein the dry etching stops on a portion of the first metal comprising layer. The masking pattern is removed using a first post etch clean for stripping the masking pattern. A multi-step solution cleaning sequence is used after the removing step and includes a first wet clean including sulfuric acid and a fluoride, and a second wet clean after the first wet clean including a fluoride. Fabrication of the IC is then completed.

31 Claims, 2 Drawing Sheets

POST METAL GATE VT ADJUST ETCH CLEAN

FIELD

The invention relates to methods of forming integrated circuits (ICs) including MOS transistors, and more particularly to methods of forming ICs including metal gate-comprising MOS transistors.

BACKGROUND

The gate stack has historically been manufactured from polysilicon on silicon dioxide or nitrided silicon oxide (SiON). Recently, the polysilicon electrode material in the stack has been replaced with metal and the silicon dioxide or SiON dielectric material in the stack has been replaced with a high-k material to improve transistor performance. For example, the metal gate electrode, being a good electrical conductor, suppresses the gate depletion layer of a MOS transistor. This arrangement changes the gate electrode/gate dielectric interface to metal on a high-k dielectric.

To further complicate the situation, to optimize performance, different metal-comprising gate materials are generally needed to provide a different work function for the NMOS devices versus the PMOS devices (generally referred to as a dual work function metal gate). In some gate stack arrangements for the dual work function metal gate, one of the metal-comprising gate electrode layers (e.g., for PMOS devices) comprises a readily oxidizable metal, such as tungsten (W).

The metal gate etch process is generally followed by a cleaning process (or "clean"). The clean is used to strip the photoresist pattern, and remove the post etch residues while attempting to maintain selectivity to the exposed metal. A significant yet to be met challenge for this clean is to be able to strip the photoresist without significantly oxidizing the metal gate electrode layer, and without generating a residue that is impossible or at least difficult to remove.

SUMMARY

This Summary is provided to comply with 37 C.F.R. §1.73, presenting a summary of the invention to briefly indicate the nature and substance of the invention. It is submitted with the understanding that it will not be used to interpret or limit the scope or meaning of the claims.

Embodiments of the invention describe a new gate stack arrangement for CMOS integrated circuits (IC) that have the dual work function metal gate, and cleans that reduce residual particles and thus improve yield and reliability of such ICs. The new gate stack comprises one of the metal gate-comprising materials (for PMOS devices) referred to herein as the first metal-comprising layer being a readily oxidizable metal, such as tungsten (W), while the other metal gate-comprising material (for NMOS devices) comprises a silicide of the same first metal (e.g., $WSi_2$). One embodiment of the invention comprises a multi-step wet cleaning sequence for cleaning a semiconductor wafer surface, that includes a first wet clean consisting essentially of sulfuric acid and a fluoride, a second wet clean after the first clean comprising a fluoride, and a third dilute wet clean after the second wet clean comprising a hydroxide and a peroxide. The third dilute wet clean comprises a volume ratio of the hydroxide to the peroxide in a range from 1:2 to 2:1 and a volume ratio of the hydroxide combined with the peroxide to deionized (DI) water from 1:250 to 1:1,000. The third dilute wet clean is operable to remove particles without etching significant amounts of exposed metal.

The process integration for such dual work function metal gate arrangements can comprise selectively forming the silicide (e.g., over only the NMOS regions) from a first metal such as W by a conventional annealing process. The selective silicide process generally comprises a blanket deposition of a polysilicon or amorphous silicon layer on the first metal to form an intermediate gate stack. The intermediate gate stack is generally then patterned, such as by plasma etching through the top polysilicon or amorphous silicon, stopping on the metal (e.g., W). This etch process is followed by a series of cleans. A first clean is used to strip the masking pattern such as a photoresist pattern, and a multi-step wet clean sequence following the first clean is used to remove post etch residues while maintaining selectivity to the exposed metal (e.g., W). Significantly, cleans according to embodiments of the invention also have been found to minimize etch induced residue that is impossible or at least difficult to remove, such as arrangements of silicon and the gate electrode metal generated by the dry etch used to pattern the intermediate gate stack.

DETAILED DESCRIPTION OF EMBODIMENTS

Figure 1:
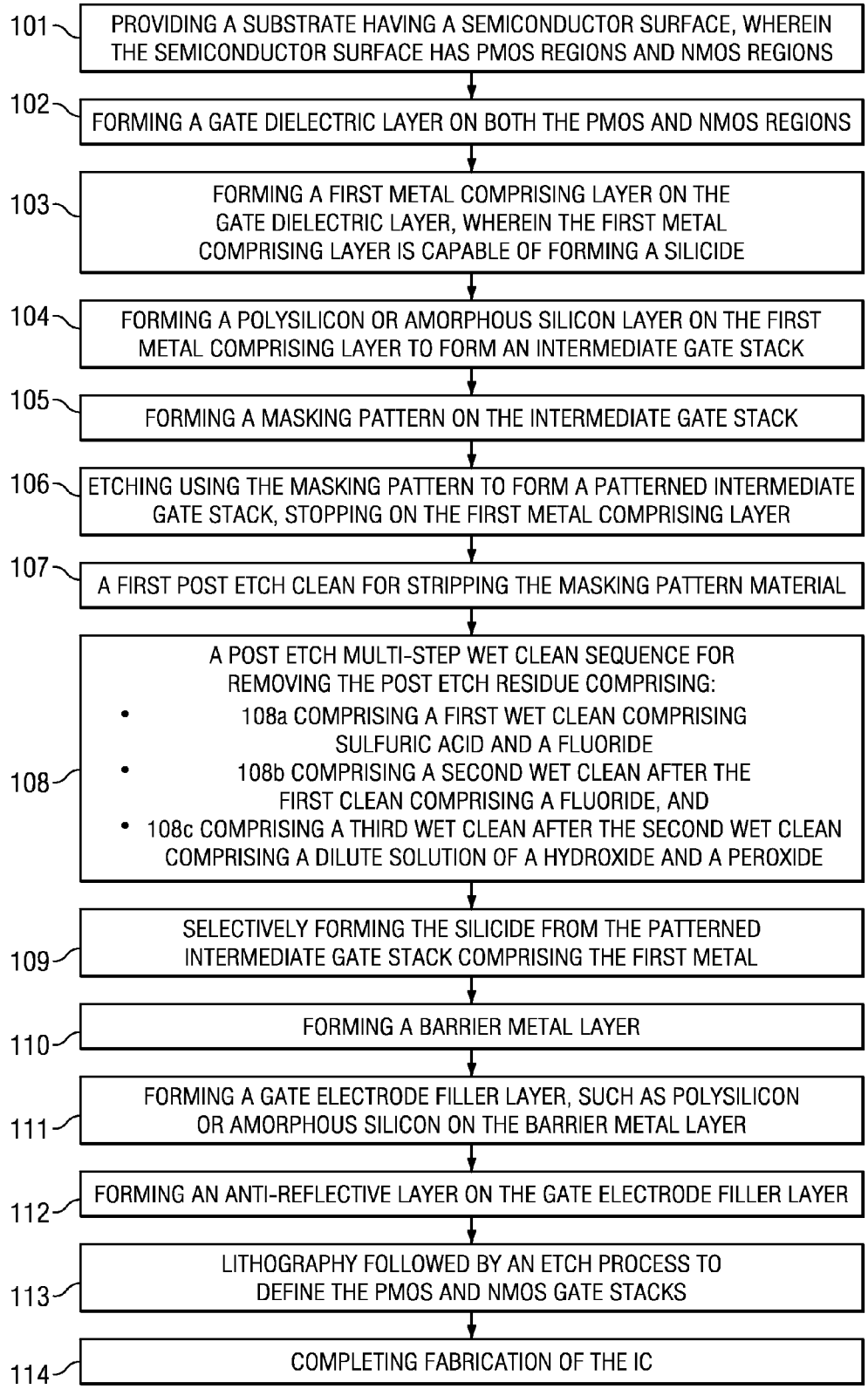
FIG. 1 shows a flow diagram for a first method for fabricating a metal gate-comprising CMOS integrated circuit (IC) including a cleaning process for removing dry etch generated residue following dry etching of a polysilicon or amorphous silicon layer that is on top of a first metal-comprising layer, according to a first embodiment of the invention.

The invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

FIG. 1 shows a flow diagram for a first method 100 for fabricating a metal gate-comprising CMOS integrated circuit (IC) including a cleaning process for removing dry etch generated residue following dry etching of a polysilicon or amorphous silicon layer that is on top of a first metal layer, according to a first embodiment of the invention. As described above, the first metal-comprising layer is a readily oxidizable metal, such as tungsten (W), which is used as the gate electrode material for one of the device types (e.g., PMOS devices), while the gate electrode-comprising material for the other device type (e.g., for NMOS devices) comprises a silicide of the same first metal (e.g., $WSi_2$). Embodiments of the invention have been demonstrated to provide a substantially cleaner post dry etch surface, without any significant metal gate (e.g., W) loss or metal oxide formation.

Step 101 comprises providing a substrate having a semiconductor surface, wherein the semiconductor surface has PMOS regions (e.g., n-) for PMOS devices and NMOS regions (e.g., p-) for NMOS devices and an isolation structures (e.g., trench isolation structures) between the PMOS and NMOS devices. Step 102 comprises forming a gate dielectric layer on both PMOS (e.g., n-) and NMOS (e.g., p-) regions. The gate dielectric can be thermally grown (e.g., thermally grown silicon oxide) or can be a deposited gate dielectric, such as a high-k dielectric. The high-k dielectric generally has a k-value >10. Example high-k dielectrics can include hafnium oxide, hafnium silicon oxide, hafnium silicon oxynitride, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric can comprise both hafnium (Hf) and zirconium (Zr). In one particular embodiment, the high-k gate dielectric is a hafnium-comprising gate dielectric layer that comprises 1 nm to 5 nm of HfSiON, wherein the HfSiON comprises 30 to 60 at. wt. % $SiO_2$ and 2 to 20 at. wt. % N with the balance being HfO. HfSiON can be formed by nitriding HfSiO.

Step 103 comprises forming a first metal-comprising layer on the gate dielectric layer, wherein the first metal-comprising layer is capable of forming a silicide and is generally a readily oxidizable metal. In one embodiment of the invention, the first metal-comprising layer can comprise a refractory metal. As known in the art, the refractory metals include niobium (also known as columbium), tantalum, molybdenum, tungsten, and rhenium. Step 104 comprises forming a polysilicon or amorphous silicon layer on the first metal-comprising layer to form an intermediate gate stack. Step 105 comprises forming a masking pattern on the intermediate gate stack. The masking pattern generally comprises photoresist, but may also comprise a hard mask material. Step 106 comprises etching using the masking pattern to form a patterned intermediate gate stack. The etching can comprise a plasma etch which etches through the top polysilicon or amorphous silicon layer for one of the device types (e.g., the PMOS devices) stopping on the first metal-comprising layer.

Figure 2:
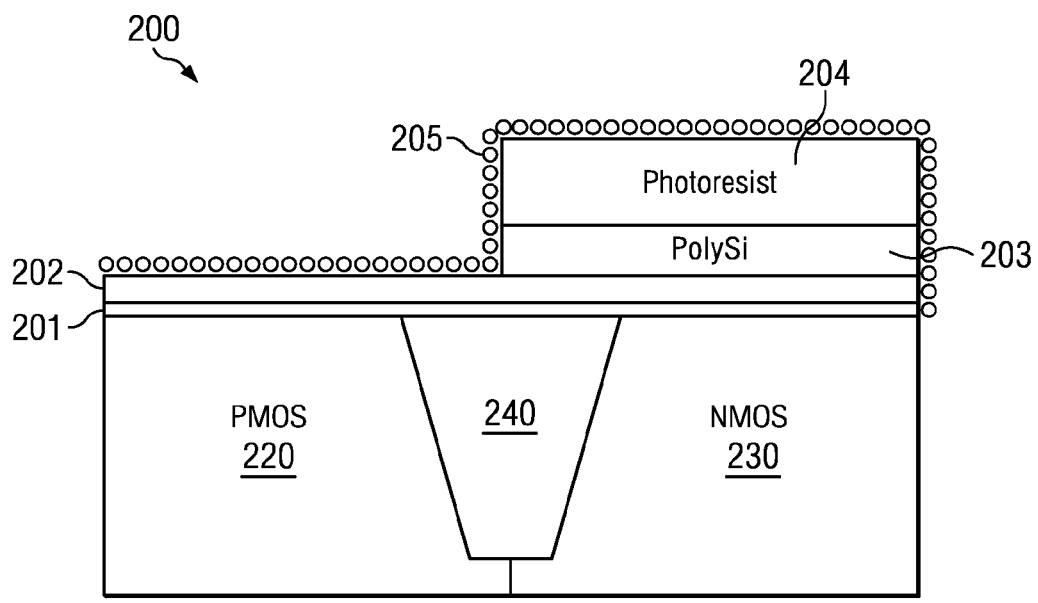
FIG. 2 shows an example cross section after etching the polysilicon or amorphous silicon layer, showing deposited etch residue on the surface of the first metal-comprising layer and on the surface of the masking layer.

FIG. 2 shows an example cross section 200 after etching the polysilicon or amorphous silicon layer, showing deposited etch residue 205 on the surface of the first metal-comprising layer 202 and on the surface of the masking layer, shown as photoresist 204. A blanket dielectric layer 201, such as a high-k dielectric layer, is shown on the surface of both PMOS device region 220 and NMOS device region 230. An isolation region 240 is shown. First metal-comprising layer 202 is shown as a blanket layer on the gate dielectric layer 201, and generally comprises W or another refractory metal. The photoresist layer 204 is on a polysilicon or amorphous silicon layer 203 that is shown as being selectively located over NMOS regions 230, wherein the polysilicon or amorphous silicon layer 203 is on the first metal-comprising layer 202.

The deposited post etch residue 205 is shown on both the first metal-comprising layer 202 over the PMOS device region 220 and the photoresist layer over the NMOS device region 230. The deposited post edge residue 205 can generally comprise various residue materials including photoresist residue, silicon residue as well as silicon/metal-comprising assemblies, with the metal being supplied by the etching of the first metal-comprising layer during etching of the polysilicon or amorphous silicon layer 203. The assemblies can also comprise oxygen, or other species present during the etching of the polysilicon or amorphous silicon layer 203. The inventors have found that some of the deposited post etch residue 205, such as with the assemblies described above, if allowed to reach a significant annealing temperature, such as at least 450° C., tend to bond to the first metal-comprising layer 202 forming one or more new residue materials that tend to not be possible to remove or are at least very difficult to remove. However, clean processes according to embodiments of the invention including the example clean processes described below relative to steps 107 and 108 can be used to strip the photoresist pattern, and remove a large percentage of the deposited post etch residues 205 while maintaining selectivity to the exposed first metal-comprising layer 202, without significantly oxidizing the first metal-comprising layer 202 or generating a residue that is impossible or at least difficult to later remove.

Returning to FIG. 1, step 107 comprises a first post etch clean for stripping the photoresist 204 or other masking material. The first post etch clean can comprise an ashing process, such as a reducing ash to avoid or at least minimize oxidation of the first metal-comprising layer 202. In one embodiment the reducing ash comprises a hydrogen/nitrogen ash. Step 108 comprises a post etch wet clean for removing the post etch residues while maintaining selectivity to the exposed first metal-comprising layer. The combination of steps 107 and 108 is generally capable of stripping the masking layer such as photoresist 204 without significantly oxidizing the first metal-comprising layer 202, and is capable of removing post etch residue 205, without generating any significant residue that is impossible or at least difficult to remove.

Step 108 generally comprises a multi-step wet cleaning sequence. One or more of the steps of the multi-step cleaning sequence can be performed in a spray tool, or be performed in conventional wet etch tanks. Step 108a comprises a first wet clean comprising sulfuric acid and a fluoride. The fluoride can comprise hydrogen fluoride (HF), ammonium fluoride, tetramethylammonium fluoride, ammonium hydrogen fluoride, fluoroboric acid or tetramethylammonium tetrafluoroborate. The first wet clean is generally performed at a temperature of at least 40° C., such as between 60° C. and 120° C. In one particular embodiment the fluoride in the first wet clean comprises HF and the first wet clean further comprises deionized (DI) water, wherein a volume ratio (volumes described herein are all expressed as concentrated solutions, unless noted otherwise) of sulfuric acid, DI water and HF is A:B:1 wherein A is generally between 200 and 800, and B is generally between 2 and 50.

Step 108b comprises a second wet clean after the first clean comprising a fluoride. The fluoride can be one of the fluorides listed above. In one particular embodiment, the fluoride in the second clean can comprise HF, wherein the second wet clean comprises concentrated HF diluted from 50:1 to 150:1 with DI water, generally performed at a temperature of 20 to 30° C. The multi-step solution cleaning sequence in step 108 can optionally also comprise a first DI water rinse between the first and the second wet clean and a second DI water rinse after the second wet clean, wherein the first and second DI water cleans comprise megasonic agitation for at least a portion of their respective times.

Step 108c can comprise a third wet clean after the second wet clean. The third wet clean can comprise a dilute solution of a hydroxide and a peroxide, such as the cleaning solution known in the art as an SC1 clean, which comprises a 1:1 aqueous mixture of ammonium hydroxide ($NH_4OH$), hydrogen peroxide, and DI water. As known in the art, a peroxide is a compound that comprises an oxygen-oxygen single bond. As used herein, "peroxides" include peroxide forming materials. The simplest stable peroxide is hydrogen peroxide. Other peroxides include superoxides, and dioxygenyls.

More generally, the hydroxide can comprise a non-alkali metal-comprising hydroxide, such as ammonium hydroxide or an organic non-alkali metal-comprising hydroxide like tetramethylammonium hydroxide (TMAH). The hydroxide can also comprise an alkali hydroxide comprising a group IA (except H) or group IIA metal. However, alkali hydroxide etching unlike non-alkali hydroxide etching, generally adds a subsequent step to remove the alkali metal. The peroxide can comprise hydrogen peroxide, and a concentration of the ammonium hydroxide:hydrogen peroxide: DI water can be from 1:1:500 to 1:1:2,000, such as 1:1:1,500. The third wet clean can be performed at a temperature from 25 to 40° C.

Step 109 comprises selectively forming the silicide (e.g., over only the NMOS regions 230) from the first metal-comprising layer 202, such as by a conventional annealing process. Step 110 can comprise forming a barrier metal layer. Step 111 comprises forming a gate electrode filler layer, such as polysilicon or amorphous silicon. Step 112 can comprise forming an anti-reflective layer, such as an inorganic anti-reflective layer (IARC), on top of the gate electrode filler layer. Step 113 comprises lithography followed by an etch process to define the respective gate stacks over the PMOS and the NMOS regions. Step 114 comprises completing fabrication of the IC generally including LDD formation, spacer formation, and source drain formation, as well as multi-layer metal processing and other back end of the line (BEOL) processing.

Figure 3:
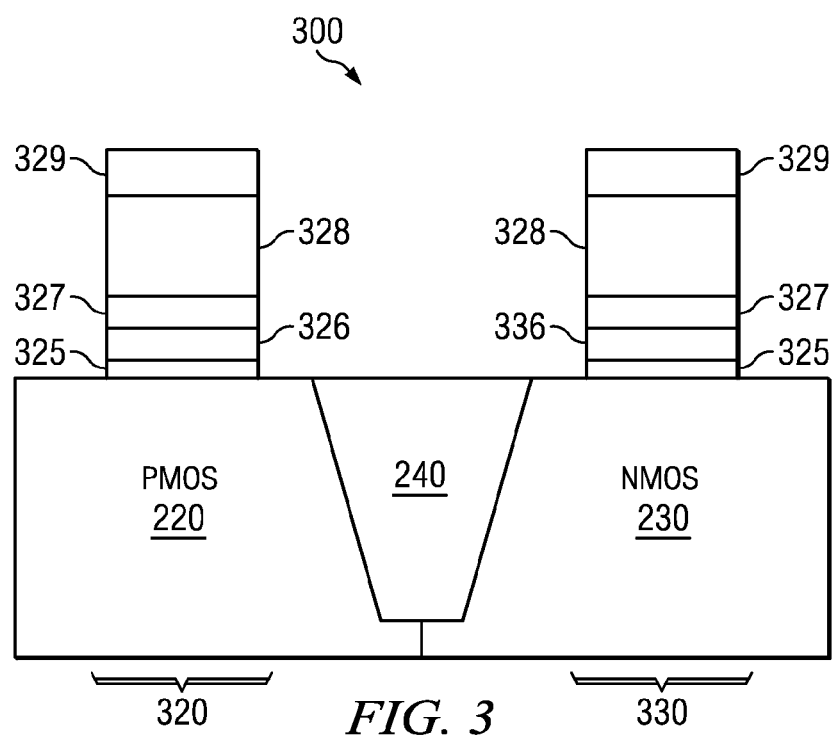
FIG. 3 shows a cross-sectional depiction of an example CMOS IC at an intermediate processing stage that can benefit from post dry etch clean processing according to embodiments of the invention.

FIG. 3 shows a cross-sectional depiction of an example CMOS IC 300 at an intermediate processing stage that can benefit from post etch clean processing according to embodiments of the invention. The intermediate processing stage is after gate etch. Example gate stacks are shown for both a PMOS device 320 and an NMOS device 330. Isolation region 240 is provided. The gate stack for PMOS device 320 comprises IARC 329/polysilicon 328/barrier metal layer 327/ metal gate layer comprising a silicidable metal (e.g., W) 326/high-k dielectric layer 325. Similarly, the gate stack for NMOS device 330 comprises IARC 329/polysilicon 328/ barrier metal layer 327/silicide gate layer (e.g., $WSi_2$) 336/ high-k dielectric layer 325.

Examples

The following non-limiting examples serve to illustrate selected embodiments of the invention. It will be appreciated that variations in proportions and alternatives in elements of the components shown will be apparent to those skilled in the art and are within the scope of embodiments of the invention.

Wafers having the structure shown in FIG. 2 were prepared. The stack comprised a 2 nm thick layer of HfSiON gate dielectric 201, a W blanket first metal-comprising layer 202 that was about 10 nm thick, a silicon layer 203 that was a 40 nm thick polysilicon layer and a photoresist masking layer 204. Images were acquired and analyzed and particles counted using a KLA-2800 Stealth from KLA Instruments (KLA-Tencor Corporation, Milpitas, Calif. 95035).

In a first inventive embodiment, a hydrogen nitrogen reducing ash, with a pressure of 10 mtorr; a power of 1,500 Watts, 200 Watt back bias and 50 sccm $N_2$ and 150 sccm $H_2$ at 20° C., was used to remove the photoresist layer 204. Reducing the back bias to 100 Watts was found to improve removal performance. The wet clean sequence used in the first embodiment comprised a first wet clean comprising a sulfuric acid/DI water/HF mixture at 80° C. for 45 seconds. The volume ratio of sulfuric acid, DI water and HF was A:B:1 wherein A was 400, and B was 25. The second wet clean which followed the first wet clean comprised 100:1 HF at 25° C. for 15 seconds. The third wet clean which followed the second wet clean comprised an ultra dilute SC1 clean (1:1:1, 500) at 35° C. for 15 seconds, followed by a rinse with DI water agitated by megasonic energy. The entire wafer surface was scanned. The surface analyzed was found to have 6,900 particles, with the residue particles and blisters generally being very small, generally in the size range from 0.25 to 0.35 μm.

Other related ash and wet clean sequence combinations were prepared for comparison to the first inventive embodiment described above. A first related combination comprised a hydrogen/nitrogen reducing ash followed by the first and second wet clean described above (no third wet clean). The surface analyzed was found to have 10,900 particles despite only scanning 70% of the wafer area (normalized to 15,517 particles). Large residue was found generally around 5 μm in size, and particle counts were so high that the particles may have had masked blisters present.

A second related combination comprised an oxidizing ash, followed by a reducing ash, followed by the first and second wet cleans described above (again, no third wet clean). The entire wafer surface was scanned. The surface analyzed was found to have 7,000 particles. Large residue was found generally around 5 μm in size, and the large residue may have again had masked blisters present.

A third related combination comprised a reducing ash, followed by an oxidizing ash followed by a reducing ash, followed by the first and second wet cleans described above (again, no third wet clean). The surface analyzed was found to have 11,600 particles, despite only scanning 70% of the wafer area (normalized to 16,571 particles). Large residue was found generally around 5 μm in size, and particle counts were so high that the particles again could have had masked blisters present.

While various embodiments of the invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

We claim:

1. A method for fabricating an integrated circuit, comprising:
   providing a substrate having a semiconductor surface, wherein the semiconductor surface has a PMOS region and an NMOS region;
   forming a gate dielectric layer over the PMOS and NMOS regions;
   forming a metal layer over the gate dielectric layer;
   forming a silicon layer over the metal layer;
   forming and patterning a mask layer over the silicon layer;
   selectively etching the silicon layer to expose the metal layer over one of the NMOS region or PMOS region, with the other of the NMOS region or PMOS region protected from etching by the patterned mask layer; and
   removing the patterned mask layer and residue from the selective etching, including conducting a first wet clean with a material comprising sulfuric acid and a fluoride; and, following the first wet clean, conducting a second wet clean with a material comprising a diluted solution of a hydroxide and a peroxide having a volume ratio of the hydroxide to the peroxide to water of 1:X:Y, wherein X is in a range of 0.5 to 1.0, and Y is at least 250.

2. A method for fabricating an integrated circuit, comprising:
   providing a substrate having a semiconductor surface, wherein the semiconductor surface has a PMOS region and an NMOS region;
   forming a high-k gate dielectric layer over the PMOS and NMOS regions;
   forming a refractory metal layer over the high-k gate dielectric layer;
   forming a silicon layer over the refractory metal layer;
   forming and patterning a photoresist mask layer over the silicon layer;
   selectively etching the silicon layer to expose the refractory metal layer over one of the NMOS region or PMOS region, with the other of the NMOS region or PMOS region protected from etching by the patterned photoresist mask layer; and
   removing the patterned photoresist mask layer and residue from the selective etching, including conducting a first wet clean with a material consisting essentially of sulfuric acid and a fluoride and at a temperature between 60 and 120° C.; and, following the first wet clean, conducting a second wet clean with a material comprising a diluted solution of a hydroxide and a peroxide having a volume ratio of the hydroxide to the peroxide to water of 1:X:Y, wherein X is in a range of 0.5 to 1.0, and Y is at least 250.

3. A method for fabricating an integrated circuit, comprising:
   forming a high-k gate dielectric layer over a semiconductor surface;
   forming a refractory metal layer over the high-k gate dielectric layer;
   forming a silicon layer over the refractory metal layer;
   forming and patterning a photoresist mask layer over the silicon layer;
   selectively etching the silicon layer to expose the refractory metal layer over a first region of the semiconductor surface, with a second region of the semiconductor surface protected from etching by the patterned photoresist mask layer; and
   removing the patterned photoresist mask layer and residue from the selective etching, including conducting a first wet clean with a material comprising sulfuric acid, deionized water and hydrofluoric acid at a temperature above 40° C.; and, following the first wet clean, conducting a second wet clean with a material comprising ammonium hydroxide, hydrogen peroxide and deionized water, with a volume ratio of ammonium hydroxide to hydrogen peroxide to deionized water of 1:X:Y, wherein X is in a range of 0.5 to 1.0, and Y is at least 250.

4. The method of claim 3, wherein Y is in a range of 500 to 2,000.

5. The method of claim 4, wherein the volume ratio 1:X:Y is about 1:1:1,500.

6. The method of claim 3, wherein a volume ratio of the sulfuric acid to the deionized (DI) water to the hydrofluoric acid in the first wet clean material is A:B:1, wherein A is generally between 200 and 800, and B is generally between 2 and 50.

7. The method of claim 3, wherein removing the patterned photoresist mask layer and the residue from the selective etching further includes, prior to conducting the first wet etch, conducting a reducing ash.

8. The method of claim 7, wherein the reducing ash comprises a hydrogen/nitrogen reducing ash.

9. The method of claim 7, wherein removing the patterned photoresist mask layer and the residue from the selective etching further includes, after conducting the second wet etch, conducting a rinse with deionized water agitated with megasonic energy.

10. The method of claim 3, wherein removing the patterned photoresist mask layer and the residue from the selective etching further includes, after conducting the second wet etch, conducting a rinse with deionized water agitated with megasonic energy.

11. The method of claim 3, wherein the refractory metal comprises tungsten.

12. The method of claim 3, further comprising selectively forming a silicide from the refractory metal layer over the second region, without forming a silicide from the refractory metal layer over the first region.

13. The method of claim 3, wherein the first region comprises a PMOS region; the second region comprises an NMOS region; the refractory metal comprises tungsten; removing the patterned photoresist mask layer and the residue from the selective etching further includes, prior to conducting the first wet etch, conducting a reducing ash, and, after conducting the second wet etch, conducting a rinse with deionized water agitated with megasonic energy; and the method further comprises selectively forming a silicide from the tungsten layer over the NMOS region, without forming a silicide from the tungsten layer over the PMOS region.

14. The method of claim 2, further comprising selectively forming a refractory metal silicide from the refractory metal layer and the silicon layer over the other of the NMOS region or PMOS region.

15. The method of claim 2, wherein, in the second wet clean material, the hydroxide comprises ammonium hydroxide and the peroxide comprises hydrogen peroxide.

16. The method of claim 2, further comprising a deionized water rinse after the second wet clean, wherein the deionized water rinse comprises megasonic agitation.

17. The method of claim 2, wherein the refractory metal comprises tungsten.

18. The method of claim 1, wherein removing the patterned mask layer and the residue further comprises conducting a reducing ash process prior to conducting the first wet clean.

19. The method of claim 1, wherein, in the second wet clean, the hydroxide comprises ammonium hydroxide, the peroxide comprises hydrogen peroxide, the water comprises deionized water, the volume ratio 1:X:Y is a volume ratio of the ammonium hydroxide to the hydrogen peroxide to the deionized water, and Y is in a range of 500 to 2,000.

20. The method of claim 19, wherein the volume ratio of the ammonium hydroxide to the hydrogen peroxide to the deionized water is about 1:1:1,500.

21. The method of claim 1, wherein the first wet clean is conducted at a temperature of at least 40° C.

22. The method of claim 21, wherein the first wet clean is conducted at a temperature of between 60 and 120° C.

23. The method of claim 22, wherein the second wet clean is conducted at a temperature in a range of 20 to 50° C.

24. The method of claim 1, wherein the metal layer comprises a refractory metal.

25. The method of claim 24, wherein the refractory metal comprises tungsten.

26. The method of claim 1, wherein removing the patterned mask layer and the residue from the selective etching further includes conducting a third wet clean with a material comprising fluoride without sulfuric acid between the first wet clean and the second wet clean; wherein the fluoride in the first wet clean material and the fluoride in the third wet clean material are selected from the group consisting of hydrogen fluoride, ammonium fluoride, tetramethylammonium fluoride, ammonium hydrogen fluoride, fluoroboric acid and tetramethylammonium tetrafluoroborate.

27. The method of claim 1, wherein removing the patterned mask layer and the residue from the selective etching further includes conducting a first deionized water rinse after the second wet clean; wherein the deionized water rinse comprises megasonic agitation.

28. The method of claim 1, wherein the gate dielectric layer comprises a high-k dielectric material.

29. The method of claim 28, wherein the high-k dielectric material comprises hafnium oxide, hafnium silicon oxide, hafnium silicon oxynitride, lanthanum oxide, zirconium oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

30. The method of claim 1, wherein the fluoride in the first wet clean material comprises hydrofluoric acid; the first wet clean material further comprises deionized water; and a volume ratio of the sulfuric acid to the deionized (DI) water to the hydrofluoric acid in the first wet clean material is A:B:1, wherein A is generally between 200 and 800, and B is generally between 2 and 50.

31. The method of claim 1, wherein removing the patterned mask layer and the residue from the selective etching further includes conducting a third wet clean between the first wet clean and the second wet clean with a material comprising hydrofluoric acid diluted from 50 to 150:1 with deionized water, and at a temperature of 20 to 30° C.

\* \* \* \* \*